US011579646B2

(12) United States Patent
Khlat et al.

(10) Patent No.: US 11,579,646 B2
(45) Date of Patent: Feb. 14, 2023

(54) POWER MANAGEMENT CIRCUIT FOR FAST AVERAGE POWER TRACKING VOLTAGE SWITCHING

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/217,654

(22) Filed: Mar. 30, 2021

(65) Prior Publication Data

US 2021/0389789 A1 Dec. 16, 2021

Related U.S. Application Data

(60) Provisional application No. 63/037,983, filed on Jun. 11, 2020.

(51) Int. Cl.
*G05F 1/575* (2006.01)
*H02M 3/07* (2006.01)
*H03G 3/30* (2006.01)

(52) U.S. Cl.
CPC .................................... *G05F 1/575* (2013.01)

(58) Field of Classification Search
CPC .... H03F 3/00; H03F 3/19; H03F 3/24; H02M 3/07–073; H03G 3/30; H03G 3/00; H03G 3/19
See application file for complete search history.

(56) References Cited

U.S. PATENT DOCUMENTS 8,159,309 B1 4/2012 Khlat et al.
8,718,188 B2 5/2014 Balteanu et al.
(Continued)

FOREIGN PATENT DOCUMENTS

DE 102019218816 A1 * 6/2020 ............... H03F 1/02
WO 2018187245 A1 10/2018
WO WO-2021016350 A1 * 1/2021 ........... H03F 1/0222

OTHER PUBLICATIONS

Mellon, L., "Data Transmission—Parallel vs Serial," Jul. 10, 2017, https://www.quantil.com/content-delivery-insights/content-acceleration/data-transmission/, 4 pages.
(Continued)

*Primary Examiner* — Sisay G Tiku
(74) *Attorney, Agent, or Firm* — Withrow & Terranova, P.L.L.C.

(57) ABSTRACT

A power management circuit for fast average power tracking (APT) voltage switching is provided. The power management circuit includes a primary voltage circuit configured to generate an APT voltage based on an APT target voltage. However, the primary voltage circuit may be inherently slow in ramping up the APT voltage to the APT target voltage. As such, a secondary voltage circuit is provided in the power management circuit to help drive the APT voltage to a desired level by a defined temporal limit. Once the APT voltage reaches the desired level, the secondary voltage circuit will automatically shut off, while the primary voltage circuit continues operating at a selected duty cycle to maintain the APT voltage at the APT target voltage. By utilizing the secondary voltage circuit to quickly drive up the APT voltage, the power management circuit is capable of supporting dynamic power control under stringent switching delay budget.

20 Claims, 7 Drawing Sheets

(56) References Cited

U.S. PATENT DOCUMENTS

| | | | | |
|---|---|---|---|---|
| 8,912,769 | B2 | 12/2014 | Lin et al. | |
| 9,020,453 | B2 | 4/2015 | Briffa et al. | |
| 9,069,365 | B2 | 6/2015 | Brown et al. | |
| 9,148,090 | B2 | 9/2015 | Tsuji | |
| 9,172,331 | B2 | 10/2015 | Nagasaku et al. | |
| 9,231,527 | B2 | 1/2016 | Hur et al. | |
| 9,350,299 | B2 | 5/2016 | Tsuji | |
| 9,391,567 | B2 | 7/2016 | Kaczman | |
| 9,407,476 | B2 | 8/2016 | Lim et al. | |
| 9,496,828 | B2 | 11/2016 | Ye | |
| 9,614,477 | B1 | 4/2017 | Rozenblit et al. | |
| 9,634,560 | B2 | 4/2017 | Ek | |
| 10,097,145 | B1 * | 10/2018 | Khlat | H03F 1/0211 |
| 10,103,926 | B1 * | 10/2018 | Khlat | H03F 1/0222 |
| 10,142,074 | B2 | 11/2018 | Wang et al. | |
| 10,243,524 | B2 | 3/2019 | Orr | |
| 10,778,094 | B2 | 9/2020 | de Cremoux | |
| 10,862,428 | B2 | 12/2020 | Henzler et al. | |
| 10,998,859 | B2 * | 5/2021 | Khlat | H03F 3/213 |
| 11,018,627 | B2 * | 5/2021 | Khlat | H03F 3/195 |
| 11,018,638 | B2 * | 5/2021 | Khlat | H03F 3/19 |
| 11,223,325 | B2 | 1/2022 | Drogi et al. | |
| 2003/0099230 | A1 | 5/2003 | Wenk | |
| 2004/0179382 | A1 | 9/2004 | Thaker et al. | |
| 2013/0141063 | A1 * | 6/2013 | Kay | G05F 1/468<br>323/271 |
| 2013/0141068 | A1 * | 6/2013 | Kay | H02M 1/14<br>323/282 |
| 2014/0312710 | A1 | 10/2014 | Li | |
| 2016/0294587 | A1 | 10/2016 | Jiang et al. | |
| 2018/0234011 | A1 * | 8/2018 | Muramatsu | G05F 1/10 |
| 2018/0257496 | A1 | 9/2018 | Andoh et al. | |
| 2018/0278213 | A1 | 9/2018 | Henzler et al. | |
| 2018/0351454 | A1 | 12/2018 | Khesbak et al. | |
| 2019/0068234 | A1 | 2/2019 | Khlat et al. | |
| 2019/0109566 | A1 | 4/2019 | Folkmann et al. | |
| 2019/0181813 | A1 * | 6/2019 | Maxim | H03F 3/21 |
| 2019/0222175 | A1 | 7/2019 | Khlat et al. | |
| 2019/0288645 | A1 | 9/2019 | Nag et al. | |
| 2019/0334750 | A1 | 10/2019 | Nomiyama et al. | |
| 2019/0356285 | A1 | 11/2019 | Khlat et al. | |
| 2020/0076297 | A1 | 3/2020 | Nag et al. | |
| 2020/0127612 | A1 | 4/2020 | Khlat et al. | |
| 2020/0136575 | A1 | 4/2020 | Khlat et al. | |
| 2020/0212796 | A1 | 7/2020 | Murphy et al. | |
| 2020/0266766 | A1 * | 8/2020 | Khlat | H03F 3/245 |
| 2020/0336105 | A1 * | 10/2020 | Khlat | H03F 1/0211 |
| 2020/0336111 | A1 | 10/2020 | Khlat | |
| 2020/0389132 | A1 | 12/2020 | Khlat et al. | |
| 2021/0036604 | A1 | 2/2021 | Khlat et al. | |
| 2021/0126599 | A1 | 4/2021 | Khlat et al. | |
| 2021/0175798 | A1 | 6/2021 | Liang | |
| 2021/0184708 | A1 * | 6/2021 | Khlat | H03F 3/68 |
| 2021/0257971 | A1 | 8/2021 | Kim et al. | |
| 2021/0265953 | A1 | 8/2021 | Khlat | |
| 2022/0021302 | A1 | 1/2022 | Khlat et al. | |
| 2022/0029614 | A1 | 1/2022 | Khlat | |
| 2022/0037982 | A1 | 2/2022 | Khlat et al. | |
| 2022/0052655 | A1 | 2/2022 | Khlat | |
| 2022/0057820 | A1 | 2/2022 | Khlat et al. | |
| 2022/0066487 | A1 | 3/2022 | Khlat | |
| 2022/0069788 | A1 | 3/2022 | King et al. | |
| 2022/0123744 | A1 | 4/2022 | Khlat | |

OTHER PUBLICATIONS

Non-Final Office Action for U.S. Appl. No. 17/237,244, dated Sep. 20, 2021, 14 pages.

Non-Final Office Action for U.S. Appl. No. 17/325,482, dated Sep. 30, 2021, 10 pages.

Non-Final Office Action for U.S. Appl. No. 17/315,652, dated Sep. 2, 2021, 7 pages.

Notice of Allowance for U.S. Appl. No. 17/237,244, dated Jan. 27, 2022, 8 pages.

Non-Final Office Action for U.S. Appl. No. 17/325,482, dated Mar. 15, 2022, 10 pages.

Non-Final Office Action for U.S. Appl. No. 17/315,652, dated Feb. 14, 2022, 12 pages.

International Search Report and Written Opinion for International Patent Application No. PCT/US2021/061721, dated Mar. 14, 2022, 13 pages.

Non-Final Office Action for U.S. Appl. No. 17/218,904, dated May 25, 2022, 14 pages.

Notice of Allowance for U.S. Appl. No. 17/315,652, dated Jun. 20, 2022, 8 pages.

International Preliminary Report on Patentability for International Patent Application No. PCT/US2021/044596, dated Sep. 1, 2022, 19 pages.

Notice of Allowance for U.S. Appl. No. 17/182,539, dated Sep. 14, 2022, 7 pages.

Notice of Allowance for U.S. Appl. No. 17/218,904, dated Aug. 26, 2022, 9 pages.

Final Office Action for U.S. Appl. No. 17/325,482, dated Aug. 16, 2022, 12 pages.

Advisory Action for U.S. Appl. No. 17/325,482, dated Oct. 14, 2022, 3 pages.

Non-Final Office Action for U.S. Appl. No. 17/408,899, dated Aug. 29, 2022, 13 pages.

Written Opinion for International Patent Application No. PCT/US2021/061721, dated Sep. 9, 2022, 7 pages.

Notice of Allowance for U.S. Appl. No. 17/325,482, dated Nov. 30, 2022, 8 pages.

Final Office Action for U.S. Appl. No. 17/408,899, dated Dec. 27, 2022, 13 pages.

* cited by examiner

POWER MANAGEMENT CIRCUIT FOR FAST AVERAGE POWER TRACKING VOLTAGE SWITCHING

RELATED APPLICATIONS

This application claims the benefit of provisional patent application Ser. No. 63/037,983, filed Jun. 11, 2020, the disclosure of which is hereby incorporated herein by reference in its entirety.

FIELD OF THE DISCLOSURE

The technology of the disclosure relates generally to an average power tracking (APT) power management circuit.

BACKGROUND

Fifth-generation (5G) new radio (NR) (5G-NR) has been widely regarded as the next generation of wireless communication technology beyond the current third-generation (3G) and fourth-generation (4G) technologies. In this regard, a wireless communication device capable of supporting the 5G-NR wireless communication technology is expected to achieve higher data rate, improved coverage range, enhanced signaling efficiency, and reduced latency across a wide range of radio frequency (RF) bands, which include a low-band (below 1 GHz), a mid-band (1 GHz to 6 GHz), and a high-band (above 24 GHz). Moreover, the wireless communication device may still support the legacy 3G and 4G technologies for backward compatibility.

In addition, the wireless communication device is also required to support local area networking technologies, such as Wi-Fi, in both 2.4 GHz and 5 GHz bands. The latest 802.11ax standard has introduced a dynamic power control feature to allow the wireless communication device to transmit a Wi-Fi signal with a maximum power ranging from −10 dBm to 23 dBm. Accordingly, a Wi-Fi power amplifier(s) in the wireless communication device must be able to adapt power level of the Wi-Fi signal on a per-frame basis. As a result, a power management circuit must be able to adapt an average power tracking (APT) voltage supplied to the Wi-Fi power amplifier(s) within Wi-Fi inter-frame spacing (IFS) to help maintain linearity and efficiency of the Wi-Fi power amplifier(s).

Notably, the Wi-Fi IFS may only last sixteen microseconds (16 μs). Depending on specific configurations of the Wi-Fi system, such as bandwidth mode, trigger frame format, modulation and coding scheme (MCS), and delays associated with Wi-Fi physical layer (PHY) and communication buses, the actual temporal limit for the power management circuit to adapt the APT voltage(s) may be as short as one-half of a microsecond (0.5 μs). In this regard, it is desirable for the power management circuit to adapt the APT voltage(s) from one level to another within a defined temporal limit (e.g., 0.5 μs).

SUMMARY

Embodiments of the disclosure relate to a power management circuit for fast average power tracking (APT) switching. The power management circuit includes a primary voltage circuit configured to generate an APT voltage based on an APT target voltage. However, the primary voltage circuit may be inherently slow in ramping up the APT voltage to the APT target voltage. As such, a secondary voltage circuit is provided in the power management circuit to help drive the APT voltage to a desired level by a defined temporal limit. Once the APT voltage reaches the desired level, the secondary voltage circuit will automatically shut off, while the primary voltage circuit continues operating at a selected duty cycle to maintain the APT voltage at the APT target voltage. By utilizing the secondary voltage circuit to quickly drive up the APT voltage, the power management circuit is capable of supporting dynamic power control under stringent switching delay budget.

In one aspect, a power management circuit is provided. The power management circuit includes a primary voltage circuit configured to generate an APT voltage at a voltage output based on a battery voltage. The power management circuit also includes a secondary voltage circuit configured to raise the APT voltage at the voltage output based on a supply voltage higher than the battery voltage. The power management circuit also includes a control circuit. The control circuit is configured to receive an APT target voltage that indicates an increase of the APT voltage at the voltage output. The control circuit is also configured to control the primary voltage circuit to provide the supply voltage to the secondary voltage circuit to thereby cause the secondary voltage circuit to raise the APT voltage to substantially equal the APT target voltage by a defined temporal limit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
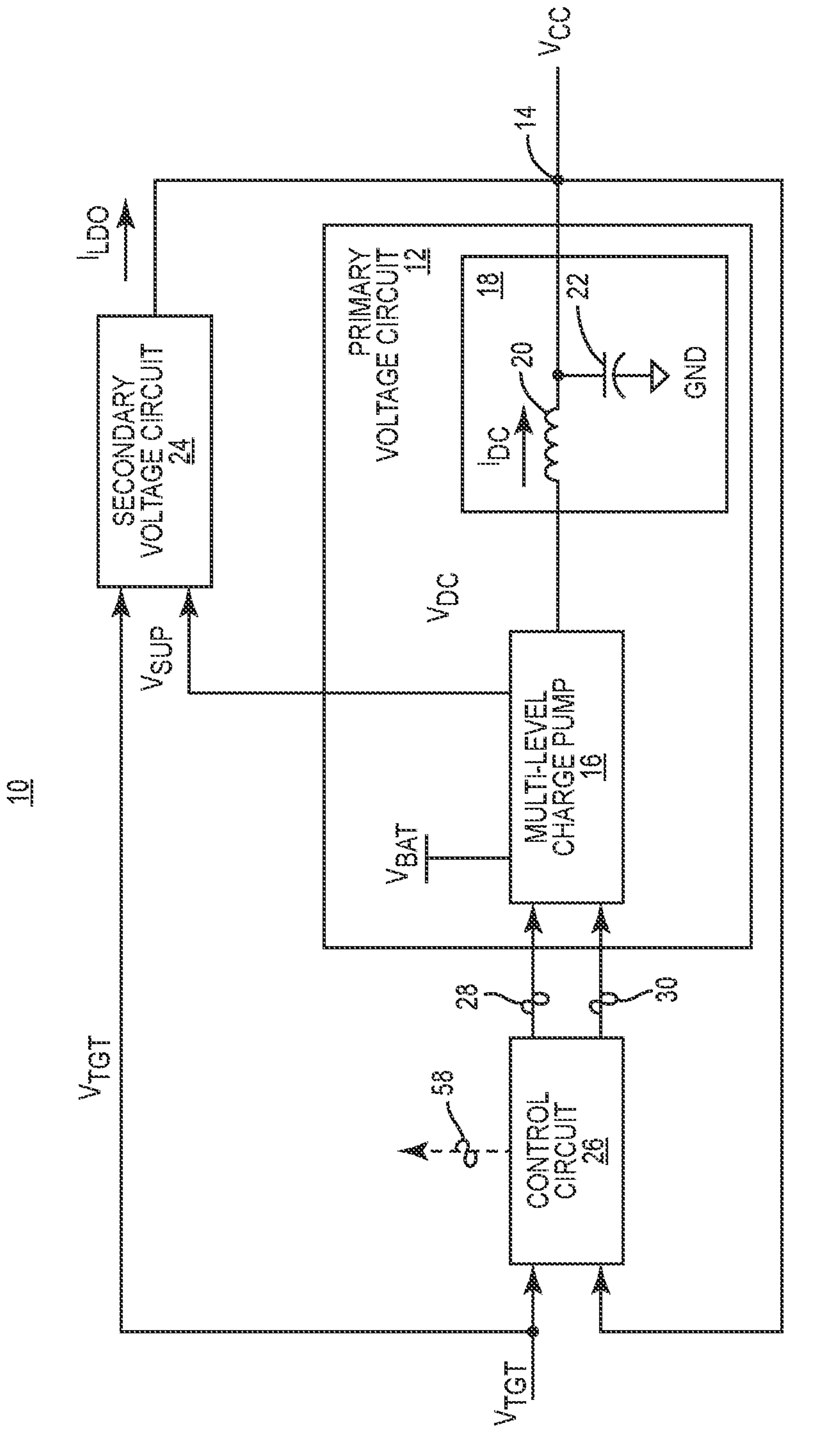
FIG. 1 is a schematic diagram of an exemplary power management circuit configured according to an embodiment of the present disclosure to support fast average power tracking (APT) voltage switching.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a power management circuit for fast average power tracking (APT) switching. The power management circuit includes a primary voltage circuit configured to generate an APT voltage based on an APT target voltage. However, the primary voltage circuit may be inherently slow in ramping up the APT voltage to the APT target voltage. As such, a secondary voltage circuit is provided in the power management circuit to help drive the APT voltage to a desired level by a defined temporal limit. Once the APT voltage reaches the desired level, the secondary voltage circuit will automatically shut off, while the primary voltage circuit continues operating at a selected duty cycle to maintain the APT voltage at the APT target voltage. By utilizing the secondary voltage circuit to quickly drive up the APT voltage, the power management circuit is capable of supporting dynamic power control under stringent switching delay budget.

FIG. 1 is a schematic diagram of an exemplary power management circuit 10 configured according to an embodiment of the present disclosure to support fast APT voltage switching. The power management circuit 10 includes a primary voltage circuit 12. The primary voltage circuit 12 is coupled to a voltage output 14 and configured to generate an APT voltage $V_{CC}$ at the voltage output 14 based on a battery voltage $V_{BAT}$. In a non-limiting example, the primary voltage circuit 12 includes a multi-level charge pump 16 and an inductor-capacitor (LC) circuit 18, which is coupled between the multi-level charge pump 16 and the voltage output 14.

As discussed below in FIGS. 2A-2D, the multi-level charge pump 16 is configured to generate a low-frequency voltage $V_{DC}$ (e.g., a constant voltage) at multiple levels based on a selected duty cycle. For example, the multi-level charge pump 16 can be configured to generate the low-frequency voltage $V_{DC}$ at zero volt (0 V) and four volts (4 V) based on a 25%-75% duty cycle. As a result, the multi-level charge pump 16 would generate an average of the low-frequency voltage $V_{DC}$ that equals three volts (3 V).

The LC circuit 18, which includes a power inductor 20 and a bypass capacitor 22, functions as a low-pass filter to output an average of the multiple levels of the low-frequency voltage $V_{DC}$ as the APT voltage $V_{CC}$. Specifically, the power inductor 20 induces a respective low-frequency current IDC (e.g., a constant current) based on each of the multiple levels of the low-frequency voltage $V_{DC}$ to charge the bypass capacitor 22. As a result, the LC circuit 18 outputs the APT voltage $V_{CC}$ that equals the average of the multiple levels of the low-frequency voltage $V_{DC}$.

In a non-limiting example, the power inductor 20 can have an inductance of 1 μH and the bypass capacitor 22 can have a capacitance of 2.2 μF. In this regard, the LC circuit 18 will have a resonance frequency of approximately 107 KHz. Accordingly, the LC circuit 18 may take 2.5 to 3 microseconds (μs) to change the APT voltage $V_{CC}$ from one level to another. However, as discussed earlier, to employ the power management circuit 10 to support dynamic power control in, for example 802.11ax, the power management circuit 10 must be able to change the APT voltage $V_{CC}$ under a stringent switching delay budget (e.g., 0.5 μs). Clearly, the primary voltage circuit 12 alone would not be able to satisfy the stringent switching delay budget.

As such, the power management circuit 10 is further configured to include a secondary voltage circuit 24. As discussed below in FIG. 3, the secondary voltage circuit 24 can help drive the APT voltage $V_{CC}$ to a desired level by a defined temporal limit (e.g., 0.5 μs). Once the APT voltage $V_{CC}$ reaches the desired level, the secondary voltage circuit 24 will automatically shut off, while the primary voltage circuit 12 continues operating at a selected duty cycle to maintain the APT voltage $V_{CC}$. By utilizing the secondary voltage circuit 24 to quickly drive up the APT voltage $V_{CC}$, the power management circuit 10 will be capable of supporting dynamic power control under the stringent switching delay budget.

The secondary voltage circuit 24 may be activated to quickly ramp up the APT voltage $V_{CC}$ in response to receiving a supply voltage $V_{SUP}$ that is higher than the battery voltage $V_{BAT}$. In a non-limiting example, the supply voltage $V_{SUP}$ can be substantially equal to two times the battery voltage $V_{BAT}$ (e.g., $V_{SUP}=2\times V_{BAT}\pm 0.1$ V). The secondary voltage circuit 24 may be configured to automatically turn itself off as soon as the APT voltage reaches the desired level. In the meantime, the primary voltage circuit 12 remains active to continue driving and/or maintaining the APT voltage $V_{CC}$ at the voltage output 14. In this regard, the primary voltage circuit 12 and the secondary voltage circuit 24 collectively cause the power management circuit 10 to increase the APT voltage $V_{CC}$ by the defined temporal limit.

Notably, the secondary voltage circuit 24 can only serve as a current source as opposed to a current sink. As such, the secondary voltage circuit 24 will only be activated when the APT voltage $V_{CC}$ is set to increase. The secondary voltage circuit 24 will remain inactive when the APT voltage $V_{CC}$ is set to decrease. In this regard, the primary voltage circuit 12 will be solely responsible to reduce the APT voltage $V_{CC}$ by generating the low-frequency voltage $V_{DC}$ at appropriate levels based on an appropriate duty cycle.

To control the primary voltage circuit 12 and/or the secondary voltage circuit 24 to collectively increase and/or decrease the APT voltage $V_{CC}$ at the voltage output 14, a control circuit 26 is provided in the power management circuit 10. The control circuit 26, which can be a field-programmable gate array (FPGA), as an example, receives an APT target voltage $V_{TGT}$ that indicates an increase of the APT voltage $V_{CC}$ from one level (e.g., 1 V) to another (e.g., 5V), or vice versa. In response to receiving the APT target voltage $V_{TGT}$ that indicates the increase of the APT voltage $V_{CC}$, the control circuit 26 controls the primary voltage circuit 12 to provide the supply voltage $V_{SUP}$ to the secondary voltage circuit 24 to thereby cause the secondary voltage circuit 24 to raise the APT voltage $V_{CC}$ to a desired level that is substantially equal to the APT target voltage $V_{TGT}$ by the defined temporal limit. In a non-limiting example, the control circuit 26 can cause the primary voltage circuit 12 to generate and provide the supply voltage $V_{SUP}$ to the secondary voltage circuit 24 by asserting a first control signal 28.

Concurrent to or subsequent to asserting the first control signal 28, the control circuit may assert a second control signal 30 to set a selected duty cycle for the primary voltage circuit 12 to thereby cause the primary voltage circuit 12 to generate the low-frequency voltage $V_{DC}$ independent of whether the secondary voltage circuit 24 is active. In this regard, the primary voltage circuit 12 and the secondary voltage circuit 24 can both be active, at least before the APT voltage $V_{CC}$ reaches the desired level that is substantially equal to the APT target voltage $V_{TGT}$.

The second control signal 30 can cause the multi-level charge pump 16 to operate in a number of different modes, as discussed next with reference to FIGS. 2A-2D. Common elements between FIGS. 1 and 2A-2D are shown therein with common element numbers and will not be re-described herein.

As illustrated in FIGS. 2A-2D, the multi-level charge pump 16 includes an input node 32, an output node 34, a reference node 36, a first intermediate node 38 (denoted as "n1"), and a second intermediate node 40 (denoted as "n2"). Specifically, the input node 32 is coupled to a battery 42 to receive the battery voltage $V_{BAT}$, and the output node 34 is coupled to the reference node 36 to output the low-frequency voltage $V_{DC}$. The multi-level charge pump 16 includes a first switch SW1, a second switch SW2, a third switch SW3, a fourth switch SW4, a fifth switch SW5, and a sixth switch SW6. The first switch SW1 is coupled between the input node 32 and the first intermediate node 38. The second switch SW2 is coupled between the first intermediate node 38 and the output node 34. The third switch SW3 is coupled between the input node 32 and the second intermediate node 40. The fourth switch SW4 is coupled between the second intermediate node 40 and a ground (GND). The fifth switch SW5 is coupled between the input node 32 and the output node 34. The sixth switch SW6 is coupled between the reference node 36 and the GND. The multi-level charge pump 16 also includes a fly capacitor $C_{FLY}$ that is coupled between the first intermediate node 38 and the second intermediate node 40.

Figure 2A:
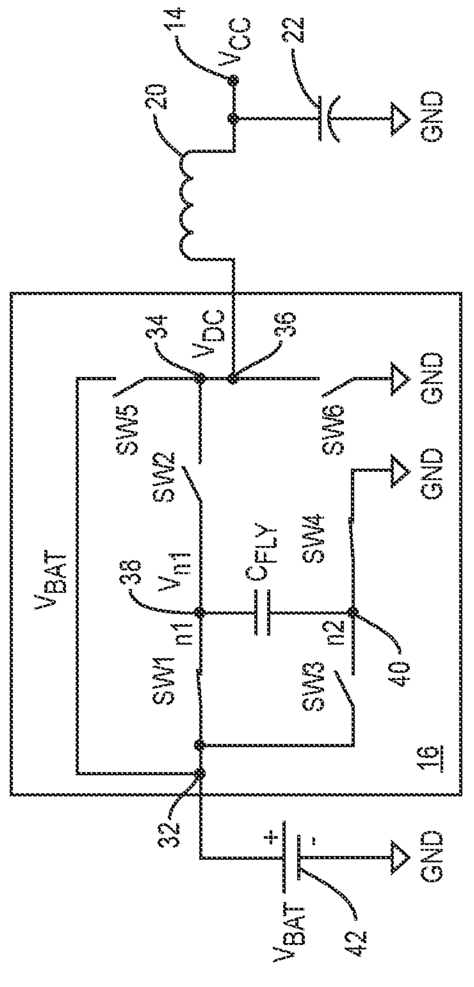
FIG. 2A-2D are schematic diagrams providing exemplary illustration of different operating modes of a multi-level charge pump in the power management circuit of FIG. 1.

FIG. 2A illustrates a first operation mode of the multi-level charge pump 16 to charge the fly capacitor $C_{FLY}$ without outputting the low-frequency voltage $V_{DC}$ at the reference node 36. In the first operation mode, the control circuit 26 asserts the second control signal 30 to close the first switch SW1 and the fourth switch SW4 to charge the fly capacitor $C_{FLY}$ to pull the first intermediate node 38 up to a node voltage $V_{n1}$ that equals the battery voltage $V_{BAT}$. The control circuit 26 further opens the second switch SW2, the third switch SW3, the fifth switch SW5, and the sixth switch SW6 to cause the multi-level charge pump 16 not to output the low-frequency voltage $V_{DC}$ at the reference node 36.

Figure 2B:
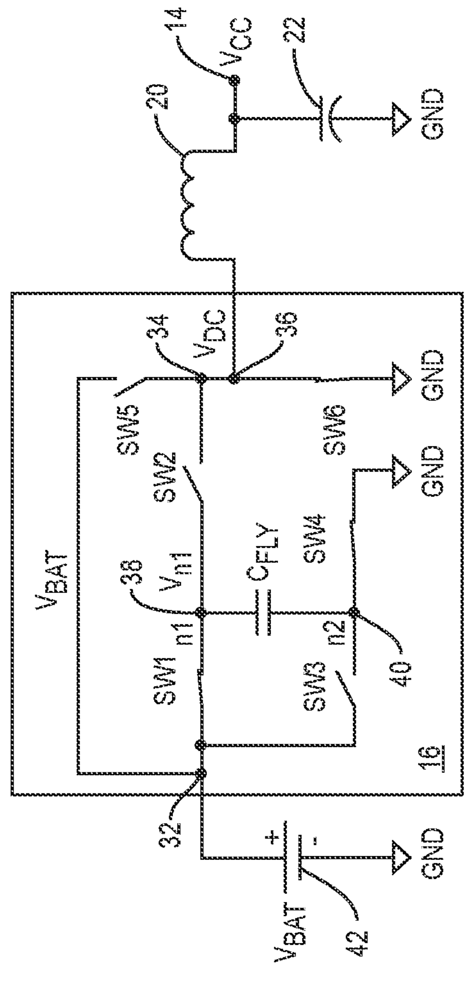

FIG. 2B illustrates a second operation mode of the multi-level charge pump 16 to charge the fly capacitor $C_{FLY}$ while outputting the low-frequency voltage $V_{DC}$ at zero volt (0 V). In the second operation mode, the control circuit 26 asserts the second control signal 30 to close the sixth switch SW6, while keeping the second switch SW2, the third switch SW3, and the fifth switch SW5 open, to pull the reference node 36 to the GND to thereby output the low-reference voltage $V_{DC}$ at 0 V. In the meantime, the control circuit 26 may further close the first switch SW1 and the fourth switch SW4 to charge the fly capacitor $C_{FLY}$ to pull the first intermediate node 38 up to the node voltage $V_{n1}$ that equals the battery voltage $V_{BAT}$.

Figure 2C:
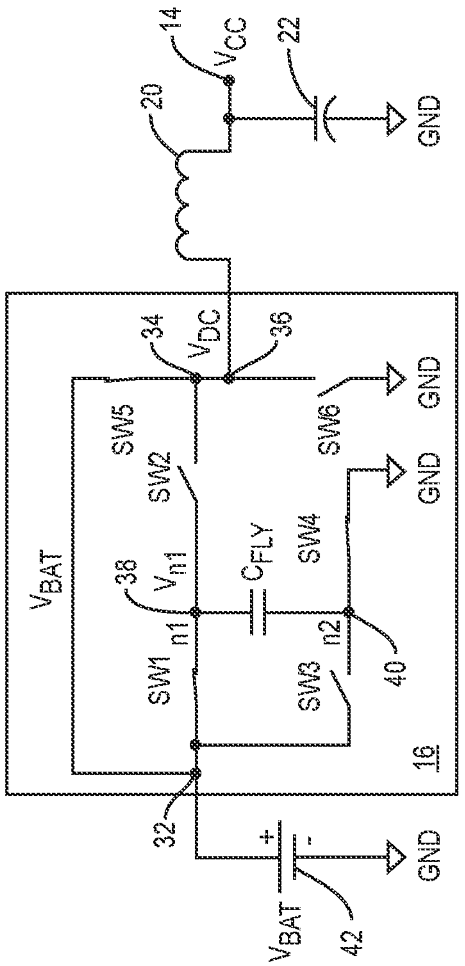

FIG. 2C illustrates a third operation mode of the multi-level charge pump 16 to charge the fly capacitor $C_{FLY}$ while outputting the low-frequency voltage $V_{DC}$ at the battery voltage $V_{BAT}$. In the third operation mode, the control circuit 26 asserts the second control signal 30 to close the fifth switch SW5, while keeping the second switch SW2, the third switch SW3, and the sixth switch SW6 open, to couple the output node 34 directly to the battery 42 to thereby output the low-reference voltage $V_{DC}$ at the battery voltage $V_{BAT}$. In the meantime, the control circuit 26 may further close the first switch SW1 and the fourth switch SW4 to charge the fly capacitor $C_{FLY}$ to pull the first intermediate node 38 up to the node voltage $V_{n1}$ that equals the battery voltage $V_{BAT}$.

Figure 2D:
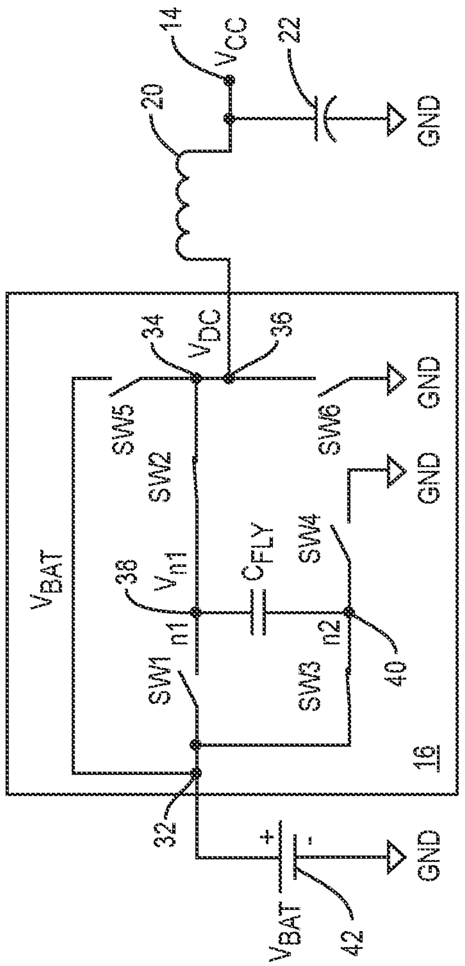

FIG. 2D illustrates a fourth operation mode of the multi-level charge pump 16 to output the low-frequency voltage $V_{DC}$ at two times the battery voltage $V_{BAT}$ without charging the fly capacitor $C_{FLY}$. In the fourth operation mode, the control circuit 26 asserts the second control signal 30 to close the second switch SW2 and the third switch SW3, while keeping the first switch SW1, the fourth switch SW4, the fifth switch SW5, and the sixth switch SW6 open, to thereby output the low-reference voltage $V_{DC}$ at two times the battery voltage $V_{BAT}$. Notably, the fly capacitor $C_{FLY}$ will not be charged in the fourth operation mode. As a result, the node voltage $V_{n1}$ can decay over time.

With reference back to FIG. 1, the control circuit 26 can use the second control signal 30 to toggle the multi-level charge pump 16 between the first operation mode, the second operation mode, the third operation mode, and/or the fourth operation mode based on a selected duty cycle to generate the low-frequency voltage $V_{DC}$ at multiple levels to thereby enable the LC circuit 18 to output the average of the multiple levels of the low-frequency voltage $V_{DC}$ as the APT voltage $V_{CC}$. Assuming that the battery voltage $V_{BAT}$ is 4 V, the control circuit 26 may toggle the multi-level charge pump 16 between the third operation mode and the fourth operation mode based on a 25%-75% duty cycle to thereby cause the LC circuit 18 to output the APT voltage $V_{CC}$ at 7 V (4V*25%+8V*75%). Thus, by toggling the multi-level charge pump 16 between different operation modes in accordance with different duty cycles, it is possible to cause the LC circuit 18 to output the APT voltage $V_{CC}$ at different levels.

Figure 3:
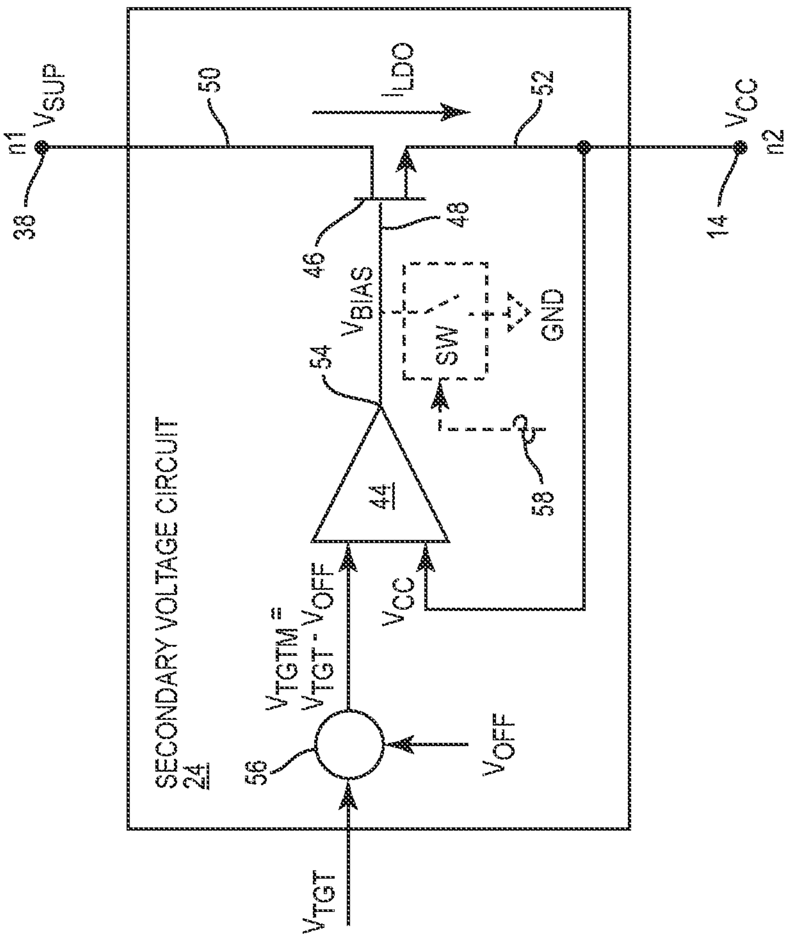
FIG. 3 is a schematic diagram providing an exemplary illustration of a secondary voltage circuit in the power management circuit of FIG. 1.

As discussed earlier, the secondary voltage circuit 24 is provided in the power management circuit 10 to swiftly drive up the APT voltage $V_{CC}$ within the defined temporal limit. In this regard, FIG. 3 is a schematic diagram providing an exemplary illustration of the secondary voltage circuit 24 in the power management circuit 10 of FIG. 1. Common elements between FIGS. 1 and 3 are shown therein with common element numbers and will not be re-described herein.

In a non-limiting example, the secondary voltage circuit 24 includes an error amplifier 44 and a low dropout (LDO) transistor 46, which is a p-type field-effect transistor (pFET) in this example. The LDO transistor 46 includes a gate electrode 48, a drain electrode 50, and a source electrode 52. The gate electrode 48 is coupled to an output 54 of the error amplifier 44 to receive a bias voltage $V_{BIAS}$. The drain electrode 50 is coupled to the first intermediate node 38 in the multi-level charge pump 16 in FIGS. 2A-2D to receive the supply voltage $V_{SUP}$. The source electrode 52 is coupled to the voltage output 14 to raise the APT voltage $V_{CC}$ based on the supply voltage $V_{SUP}$. Notably, when the LDO transistor 46 is turned on, the supply voltage $V_{SUP}$ can drive an LDO current Imo, which can be up to 13 Amps, toward the voltage output 14 to thereby quickly raise the APT voltage $V_{CC}$ at the voltage output 14.

Notably, when the secondary voltage circuit 24 is activated to help quickly raise the APT voltage $V_{CC}$ toward the APT target voltage $V_{TGT}$, the primary voltage circuit 12 is concurrently driving the APT voltage $V_{CC}$ toward the APT target voltage $V_{TGT}$. To prevent the primary voltage circuit 12 and the secondary voltage circuit 24 from competing with each other, the secondary voltage circuit 24 may be configured to raise the APT voltage $V_{CC}$ to a modified APT target voltage $V_{TGTM}$ that is lower than but substantially close to the APT target voltage $V_{TGT}$ ($V_{TGTM}<V_{TGT}$).

In this regard, the secondary voltage circuit 24 may include a calculator 56 configured to generate the modified APT target voltage $V_{TGTM}$. The modified APT target voltage $V_{TGTM}$ may be generated by subtracting a predetermined offset voltage $V_{OFF}$ (e.g., 0.2 V) from the APT target voltage $V_{TGT}$ ($V_{TGTM}=V_{TGT}-V_{OFF}$). The error amplifier 44 may be configured to compare the APT voltage $V_{CC}$ against the modified APT target voltage $V_{TGTM}$ to thereby generate the bias voltage $V_{BIAS}$ at the output 54 to drive the LDO transistor 46. As such, the LDO transistor 46 and, thus, the secondary voltage circuit 24 will be automatically turned off when the APT voltage $V_{CC}$ becomes equal to the modified APT target voltage $V_{TGTM}$. In the meantime, the primary voltage circuit 12 will remain active to continue driving the APT voltage $V_{CC}$ toward the APT target voltage $V_{TGT}$.

Figure 4:
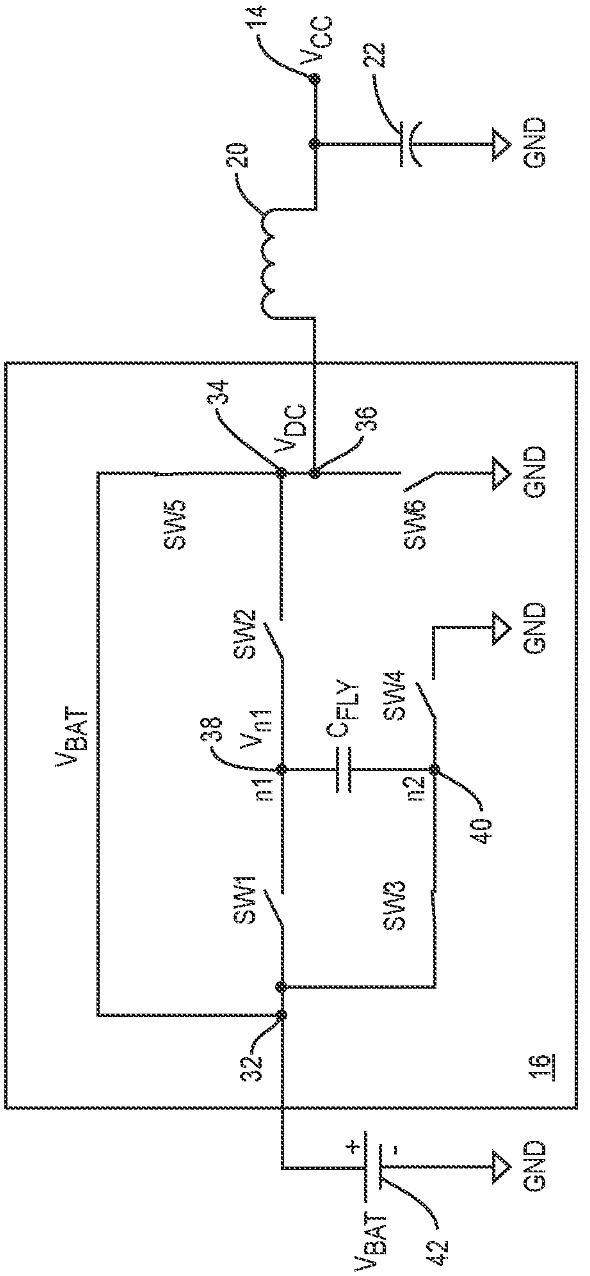
FIG. 4 is a schematic diagram providing an exemplary illustration of another operating mode of the multi-level charge pump in FIGS. 2A-2D to activate the secondary voltage circuit in FIG. 3.

As previously mentioned, the primary voltage circuit 12 is configured to generate the supply voltage $V_{SUP}$ that can be equal to two times the battery voltage $V_{BAT}$. As such, the multi-level charge pump 16 is further configured to operate in a fifth operation mode, which will be further discussed below with reference to FIG. 4. In this regard, FIG. 4 is a schematic diagram providing an exemplary illustration of a fifth operating mode of the multi-level charge pump 16 in FIGS. 2A-2D to activate the secondary voltage circuit 24 in FIG. 3. Common elements between FIGS. 2A-2D and 4 are shown therein with common element numbers and will not be re-described herein.

Prior to operating in the fifth operation mode, the multi-level charge pump 16 may need to operate in the first operation mode (as shown in FIG. 2A), the second operation mode (as shown in FIG. 2B), or the third operation mode (as shown in FIG. 2C) such that the fly capacitor $C_{FLY}$ can be charged to thereby pull the first intermediate node 38 (a.k.a. "n1") up to the node voltage $V_{n1}$ that equals the battery voltage $V_{BAT}$. Subsequently, in the fifth operation mode, the control circuit 26 may assert the first control signal 28 to close the third switch SW3 and the fifth switch SW5, while keeping the first switch SW1, the second switch SW2, the fourth switch SW4, and the sixth switch SW6 open. By closing the third switch SW3, the node voltage $V_{n1}$ is pulled up to two times the battery voltage $V_{BAT}$. By closing the fifth switch SW5, the multi-level charge pump 16 outputs the low-frequency voltage $V_{DC}$ at the battery voltage $V_{BAT}$.

As discussed earlier in FIG. 3, the drain electrode 50 of the LDO transistor 46 is coupled to the first intermediate node 38. As such, since the node voltage $V_{n1}$ at the first intermediate node 38 has been pulled up to two times the battery voltage $V_{BAT}$, the LDO transistor 46 will receive the supply voltage $V_{SUP}$ that equals two times the battery voltage $V_{BAT}$, thus allowing the secondary voltage circuit 24 to raise the APT voltage $V_{CC}$ to the modified APT target voltage $V_{TGTM}$ by the defined temporal limit (e.g., 0.5 μs).

Given that the secondary voltage circuit 24 is able to quickly raise the APT voltage $V_{CC}$ by the defined temporal limit, it may not be necessary for the primary voltage circuit 12 to stay in the fifth operation mode for very long. For example, the control circuit 26 can de-assert the first control signal 28 after a predetermined delay (e.g., 2 μs) to bring the primary voltage circuit 12 out of the fifth operation mode, thus allowing the fly capacitor $C_{FLY}$ to be recharged. Concurrently or subsequently, the control circuit may assert the second control signal 30 to toggle between closing the second switch SW2 and opening the fifth switch SW5 to output the low-reference voltage $V_{DC}$ at two times the battery voltage $V_{BAT}$ and closing the fifth switch SW5 and opening the second switch SW2 to output the low-frequency voltage $V_{DC}$ at the battery voltage $V_{BAT}$ based on a selected duty cycle. By doing so, the primary voltage circuit 12 can continue driving the APT voltage $V_{CC}$ toward the APT target voltage $V_{TGT}$ after the secondary voltage circuit 24 turns itself off.

Figure 5:
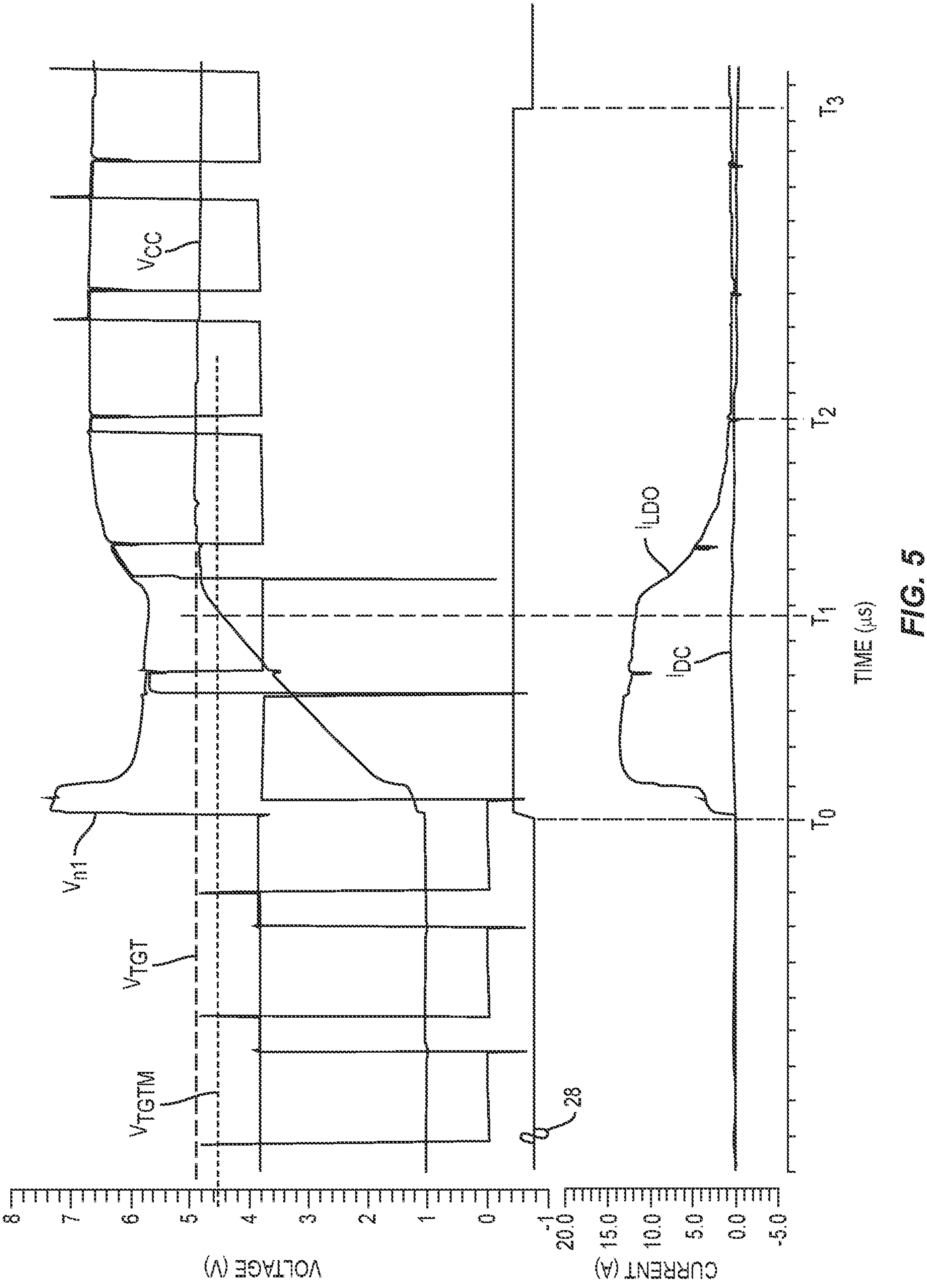
FIG. 5 is a graphic diagram providing an exemplary illustration of an operation of the power management circuit of FIG. 1 according to an embodiment of the present disclosure.

Operation of the power management circuit 10 for supporting fast APT voltage switching can be further illustrated via a graphic diagram. In this regard, FIG. 5 is a graphic diagram providing an exemplary illustration of an operation of the power management circuit 10 of FIG. 1 according to an embodiment of the present disclosure. Common elements between FIGS. 1, 2A-2D, and 5 are shown therein with common element numbers and will not be re-described herein.

Prior to time $T_0$, the multi-level charge pump 16 may operate in any of the first operation mode, the second operation mode, and the third operation mode to charge the fly capacitor $C_{FLY}$ to thereby pull the node voltage $V_{n1}$ at the first intermediate node 38 to the battery voltage $V_{BAT}$, which is 4 V in this example. The power management circuit 10 outputs the APT voltage $V_{CC}$ at 1 V in this example prior to the time $T_0$.

At time $T_0$, the control circuit 26 receives the APT target voltage $V_{TGT}$ that indicates an increase of the APT voltage $V_{CC}$ from a present value of 1 V to a future value of 5 V. Immediately or subsequently, the control circuit 26 asserts the first control signal 28 to cause the multi-level charge pump 16 to operate in the fifth operation mode, as described in FIG. 4, to provide the node voltage $V_{n1}$ as the supply voltage $V_{SUP}$ to the secondary voltage circuit 24 and to output the low-frequency voltage $V_{DC}$ at the battery voltage $V_{BAT}$.

In response to receiving the supply voltage $V_{SUP}$, the LDO transistor 46 in the secondary voltage circuit 24 starts driving up the LDO current $I_{LDO}$ to thereby quickly raise the APT voltage $V_{CC}$ toward the modified APT target voltage $V_{TGTM}$. By time $T_1$, the APT voltage $V_{CC}$ is raised to the modified APT target voltage $V_{TGTM}$ and the LDO transistor 46 starts to shut itself off. In the meantime, the primary voltage circuit 12 continues to generate the low-frequency current IDC that continues to drive the APT voltage $V_{CC}$ toward the APT target voltage $V_{TGT}$. At time $T_2$, the secondary voltage circuit 24 becomes inactive as the LDO current $I_{LDO}$ disappears. The control circuit 26 may de-assert the first control signal 28 at time $T_3$ such that the fly capacitor $C_{FLY}$ can be recharged. Note that the secondary voltage circuit 24 shuts itself off completely before the control circuit 26 de-asserts the first control signal 28. In this regard, it can be said that the secondary voltage circuit 24 automatically turns off independent of the first control signal 28.

As shown in FIG. 5, the secondary voltage circuit 24 can raise the APT voltage $V_{CC}$ from 1 V to the modified APT target voltage $V_{TGTM}$ by time $T_1$. However, it is possible to configure the secondary voltage circuit 24 based on another embodiment of the present disclosure to raise the APT voltage $V_{CC}$ from 1 V to the modified APT target voltage $V_{TGTM}$ even before time $T_1$.

Figure 6:
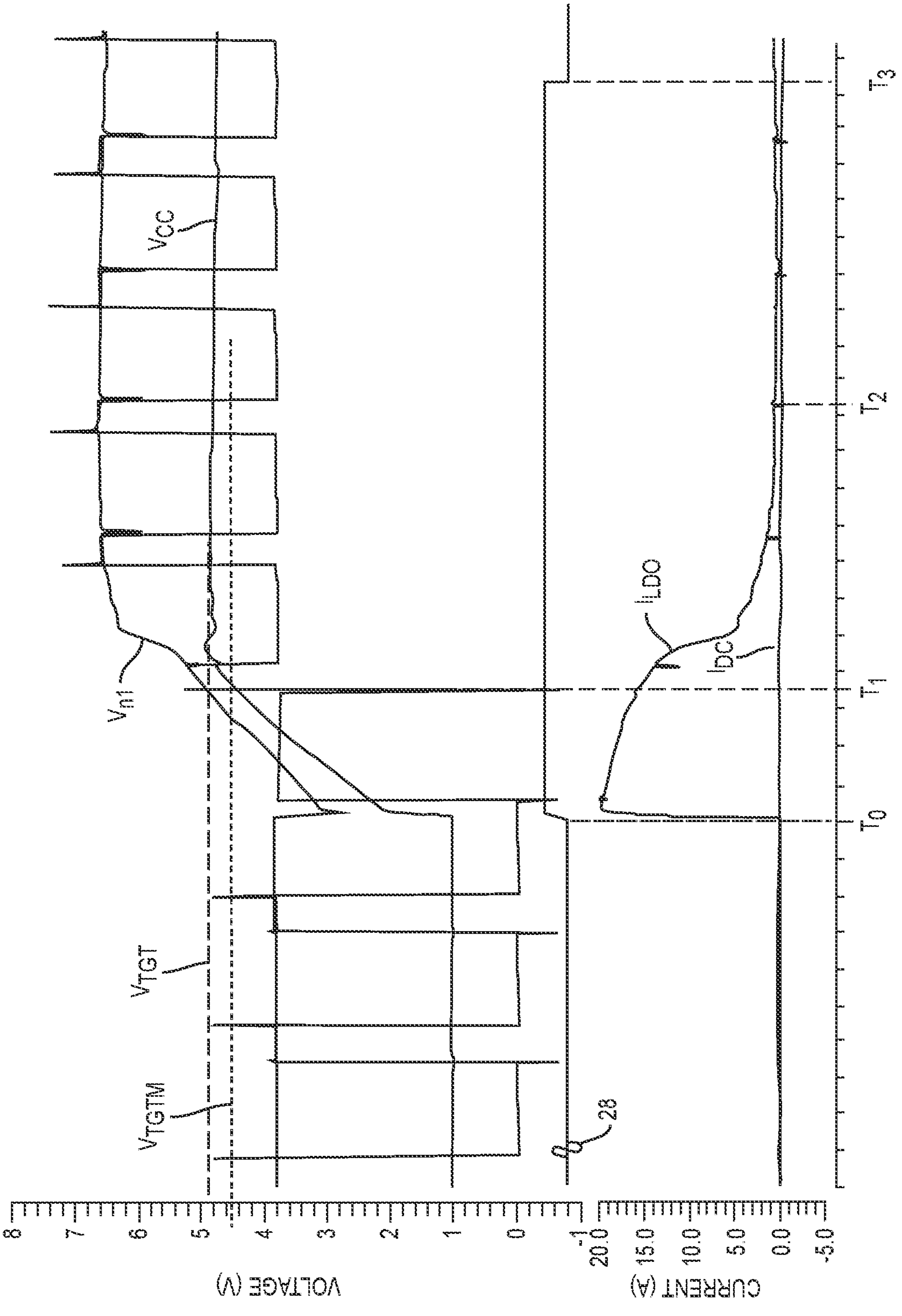
FIG. 6 is a graphic diagram providing an exemplary illustration of an operation of the power management circuit of FIG. 1 according to another embodiment of the present disclosure.

With reference back to FIG. 3, the secondary voltage circuit 24 may be configured to further include a pulldown switch SW, which may be controlled by the control circuit 26 via a third control signal 58. The pulldown switch SW is coupled between the gate electrode 48 and the GND. The control circuit 26 may close the pulldown switch SW to pull the bias voltage $V_{BIAS}$ to the GND to force the LDO transistor 46 to operate nonlinearly to thereby cause the APT voltage $V_{CC}$ to be raised to the modified APT target voltage $V_{TGTM}$ within the defined temporal limit. FIG. 6 is a graphic diagram providing an exemplary illustration of an operation of the power management circuit of FIG. 1 according to this embodiment of the present disclosure. Common elements between FIGS. 5 and 6 are shown therein with common element numbers and will not be re-described herein.

As shown in FIG. 6, the control circuit asserts the third control signal 58 at time $T_0$ to close the pulldown switch SW in the secondary voltage circuit 24. As a result, the LDO transistor 46 may drive the LDO current $I_{LDO}$ up faster than without closing the pulldown switch SW. As a result, the secondary voltage circuit 24 can raise the APT voltage $V_{CC}$ to the modified APT target voltage $V_{TGTM}$ at time $T_1$, which is earlier than time $T_1$ in FIG. 5.

Those skilled in the art will recognize improvements and modifications to the preferred embodiments of the present disclosure. All such improvements and modifications are considered within the scope of the concepts disclosed herein and the claims that follow.

What is claimed is:

1. A power management circuit comprising:

a primary voltage circuit configured to generate an average power tracking (APT) voltage at a voltage output based on a battery voltage;

a secondary voltage circuit configured to raise the APT voltage at the voltage output based on a supply voltage higher than the battery voltage; and a control circuit configured to:

receive an APT target voltage that indicates an increase of the APT voltage at the voltage output; and control the primary voltage circuit to provide the supply voltage to the secondary voltage circuit to thereby activate the secondary voltage circuit to raise the APT voltage to the APT target voltage by a defined temporal limit, wherein the secondary voltage circuit is further configured to automatically shut off when the APT voltage reaches the APT target.

2. The power management circuit of claim 1 wherein the primary voltage circuit is further configured to generate the supply voltage that is equal to two times the battery voltage.

3. The power management circuit of claim 1 wherein the control circuit is further configured to:

assert a first control signal to thereby control the primary voltage circuit to provide the supply voltage to the secondary voltage circuit;

de-assert the first control signal after the APT voltage is raised to the APT target voltage at the voltage output; and assert a second control signal to thereby control the primary voltage circuit to generate the APT voltage based on a selected duty cycle.

4. The power management circuit of claim 3 wherein the control circuit is further configured to assert the first control signal and the second control signal concurrently.

5. The power management circuit of claim 3 wherein the control circuit is further configured to assert the second control signal after asserting the first control signal.

6. The power management circuit of claim 3 wherein the secondary voltage circuit is further configured to raise the APT voltage to equal a modified APT target voltage by the defined temporal limit in response to receiving the supply voltage, wherein the modified APT target voltage is equal to the APT target voltage minus a predetermined offset voltage.

7. The power management circuit of claim 6 wherein the secondary voltage circuit comprises:

an error amplifier configured to compare the APT voltage at the voltage output against the modified APT target voltage to output a bias voltage; and a low dropout (LDO) transistor comprising:

a gate electrode coupled to the error amplifier to receive the bias voltage;

a drain electrode coupled to the primary voltage circuit to receive the supply voltage; and a source electrode coupled to the voltage output to raise the APT voltage to equal the modified APT target voltage based on the supply voltage.

8. The power management circuit of claim 7 wherein the secondary voltage circuit further comprises a calculator configured to:

receive the APT target voltage and the predetermined offset voltage; and generate and provide the modified APT target voltage to the error amplifier.

9. The power management circuit of claim 7 wherein the error amplifier is further configured to turn off the LDO transistor when the APT voltage is raised to the modified APT target voltage at the voltage output.

10. The power management circuit of claim 9 wherein the error amplifier is further configured to turn off the LDO transistor independent of whether the first control signal is deasserted.

11. The power management circuit of claim 7 wherein the secondary voltage circuit further comprises a pulldown switch coupled between the gate electrode and a ground, and the control circuit is further configured to close the pulldown switch to pull the bias voltage to the ground to thereby cause the APT voltage to be raised to the modified APT target voltage within the defined temporal limit.

12. The power management circuit of claim 7 wherein the primary voltage circuit comprises:

a multi-level charge pump configured to generate a low-frequency voltage at multiple levels at a reference node based on the battery voltage and in accordance with the selected duty cycle; and an inductor-capacitor (LC) circuit coupled between the reference node and the voltage output and configured to output an average of the multiple levels of the low-frequency voltage as the APT voltage.

13. The power management circuit of claim 12 wherein the control circuit is further configured to assert the second control signal to cause the multi-level charge pump to generate the low-frequency voltage at one or more of the multiple levels in accordance with the selected duty cycle.

14. The power management circuit of claim 12 wherein the multi-level charge pump comprises:

an input node coupled to a battery to receive the battery voltage;

an output node coupled to the reference node to output the low-frequency voltage;

a first switch coupled between the input node and a first intermediate node;

a second switch coupled between the first intermediate node and the output node;

a third switch coupled between the input node and a second intermediate node;

a fourth switch coupled between the second intermediate node and a ground;

a fifth switch coupled between the input node and the output node;

a sixth switch coupled between the reference node and the ground; and a fly capacitor coupled between the first intermediate node and the second intermediate node.

15. The power management circuit of claim 14 wherein the drain electrode of the LDO transistor is coupled to the first intermediate node of the multi-level charge pump to receive the supply voltage.

16. The power management circuit of claim 14 wherein the control circuit is further configured to:

close the first switch and the fourth switch to charge the fly capacitor to thereby pull the first intermediate node up to the battery voltage; and open the second switch, the third switch, the fifth switch, and the sixth switch to thereby not output the low-frequency voltage at the reference node.

17. The power management circuit of claim 14 wherein the control circuit is further configured to:

close the sixth switch, while keeping the second switch, the third switch, and the fifth switch open, to pull the reference node down to the ground to thereby output the low-frequency voltage at zero volt; and close the first switch and the fourth switch to thereby charge the fly capacitor to thereby pull the first intermediate node up to the battery voltage.

18. The power management circuit of claim 14 wherein the control circuit is further configured to:

close the fifth switch, while keeping the second switch, the third switch, and the sixth switch open, to output the low-frequency voltage at the battery voltage; and close the first switch and the fourth switch to thereby charge the fly capacitor to thereby pull the first intermediate node up to the battery voltage.

19. The power management circuit of claim 14 wherein the control circuit is further configured to:

close the second switch and the third switch to output the low-frequency voltage at two times the battery voltage; and open the first switch, the fourth switch, the fifth switch, and the sixth switch such that the fly capacitor is not charged.

20. The power management circuit of claim 14 wherein the control circuit is further configured to assert the first control signal to cause the third switch and the fifth switch to be closed to thereby provide the supply voltage from the first intermediate node to the drain electrode of the LDO transistor and to output the low-frequency voltage at the battery voltage.

* * * * *